United States Patent
Shimizu

(10) Patent No.: US 12,081,007 B2
(45) Date of Patent: Sep. 3, 2024

(54) IN-VEHICLE ELECTRIC COMPONENT-INTERNAL CIRCUIT UNIT

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventor: Hiroshi Shimizu, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 190 days.

(21) Appl. No.: 17/917,152

(22) PCT Filed: Mar. 31, 2021

(86) PCT No.: PCT/JP2021/013804
§ 371 (c)(1),
(2) Date: Oct. 5, 2022

(87) PCT Pub. No.: WO2021/215209
PCT Pub. Date: Oct. 28, 2021

(65) Prior Publication Data
US 2023/0163582 A1 May 25, 2023

(30) Foreign Application Priority Data
Apr. 21, 2020 (JP) .................................. 2020-075486

(51) Int. Cl.
*H02G 3/14* (2006.01)
*B60R 16/02* (2006.01)
(Continued)

(52) U.S. Cl.
CPC ............... *H02G 3/14* (2013.01); *B60R 16/02* (2013.01); *H01R 13/52* (2013.01); *H01R 13/74* (2013.01);
(Continued)

(58) Field of Classification Search
None
See application file for complete search history.

(56) References Cited

U.S. PATENT DOCUMENTS 1,421,400 A * 7/1922 Burns .................... B60J 1/2011
296/138
1,501,411 A * 7/1924 Hyatt .................... B60Q 1/245
362/426

(Continued)

FOREIGN PATENT DOCUMENTS

| JP | 2012-243449 | 12/2012 |
| JP | 2019-050681 | 3/2019 |
| WO | 2012/157331 | 11/2012 |

OTHER PUBLICATIONS

International Search Report issued in International Bureau of WIPO Patent Application No. PCT/JP2021/013804, dated Jun. 29, 2021, along with an English translation thereof.

*Primary Examiner* — Krystal Robinson
(74) *Attorney, Agent, or Firm* — GREENBLUM & BERNSTEIN, P.L.C.

(57) ABSTRACT

An in-vehicle electric component-internal circuit unit has a novel structure that can reduce the number of in-vehicle electric component-side work processes and reduce in-vehicle electric component size. An in-vehicle electric component-internal circuit unit includes: an insulative holder that holds circuit members; a wire harness that includes a coated wire, a circuit-side connection portion that is provided on an end portion on one side of the coated wire, a connector that is provided on an end portion on the other (Continued)

side of the coated wire, and a grommet through which the coated wire passes; a plate wall portion for covering a housing through-hole provided in a housing of an in-vehicle electric component; and a seal member that is provided on a first surface, which is a surface of the plate wall portion to be attached to the housing and that comes into contact with the rim of the housing through-hole.

6 Claims, 4 Drawing Sheets

(51) Int. Cl.
    *H01R 13/52*     (2006.01)
    *H01R 13/74*     (2006.01)
    *H02G 3/16*     (2006.01)
    *H02G 3/22*     (2006.01)
    *H05K 5/04*     (2006.01)
    *H05K 7/20*     (2006.01)

(52) U.S. Cl.
    CPC .................. *H02G 3/16* (2013.01); *H02G 3/22* (2013.01); *H05K 5/04* (2013.01); *H05K 7/20* (2013.01)

(56) References Cited

U.S. PATENT DOCUMENTS

| | | | | |
|---|---|---|---|---|
| 3,548,079 | A * | 12/1970 | Wold .................... | H02G 3/0675 285/915 |
| 4,041,241 | A * | 8/1977 | Olmstead ............... | H02G 3/088 277/627 |
| 4,482,176 | A * | 11/1984 | Rider, Jr. ........... | H01H 85/2045 292/87 |
| 5,864,091 | A * | 1/1999 | Sumida .................. | H02G 3/088 174/50 |
| 2014/0072835 | A1 | 3/2014 | Tsujimura et al. | |

* cited by examiner

IN-VEHICLE ELECTRIC COMPONENT-INTERNAL CIRCUIT UNIT

TECHNICAL FIELD

The present disclosure relates to an in-vehicle electric component-internal circuit unit that is housed inside a housing of an in-vehicle electric component.

BACKGROUND ART

Patent Document 1 discloses a structure in which, together with a battery module, a battery control system, etc., circuit units such as a junction box are housed inside a housing of a battery pack that is an in-vehicle electric component to be installed in a vehicle. Here, in order to enable the circuit units housed inside the battery-pack housing to be connected to external devices, a structure is adopted in which connectors to which external mating connectors are to be connected are provided on a peripheral wall of the housing, and the connectors and the circuit units are conductively connected using coated wires and bus bars.

CITATION LIST

Patent Documents

Patent Document 1: JP 2012-243449A

SUMMARY OF INVENTION

Technical Problem

In the structure disclosed in Patent Document 1, work for connecting the circuit units and the connectors provided on the housing needs to be performed when the circuit units are attached to the battery pack. Thus, there was a problem that the number of battery-pack-side work processes was increased. Furthermore, a space for carrying out the connection work is necessary between the circuit units and the connectors provided on the housing, and battery-pack size was increased in proportion to the space.

In view of this, disclosed is an in-vehicle electric component-internal circuit unit having a novel structure that can reduce the number of in-vehicle electric component-side work processes and reduce in-vehicle electric component size.

Solution to Problem

An in-vehicle electric component-internal circuit unit according to the present disclosure includes: an insulative holder that holds a circuit member; a wire harness that includes a coated wire, a circuit-side connection portion that is provided on an end portion on one side of the coated wire and connected to the circuit member, a connector that is provided on an end portion on the other side of the coated wire, and a cylindrical grommet through which the coated wire passes; a plate wall portion for covering a housing through-hole provided in a housing of an in-vehicle electric component; and an annular seal member that is provided on a first surface, which is a surface of the plate wall portion to be attached to the housing, and that comes into contact with the rim of the housing through-hole, wherein the wire harness passes through a grommet attachment hole that is provided so as to extend through the plate wall portion in a plate thickness direction, and the grommet attachment hole is sealed due to the grommet of the wire harness being in close contact with the grommet attachment hole.

Advantageous Effects of Invention

According to the present disclosure, an in-vehicle electric component-internal circuit unit having a novel structure that can reduce the number of in-vehicle electric component-side work processes and reduce in-vehicle electric component size can be provided.

DESCRIPTION OF EMBODIMENTS

Description of Embodiments of Present Disclosure

Figure 1:
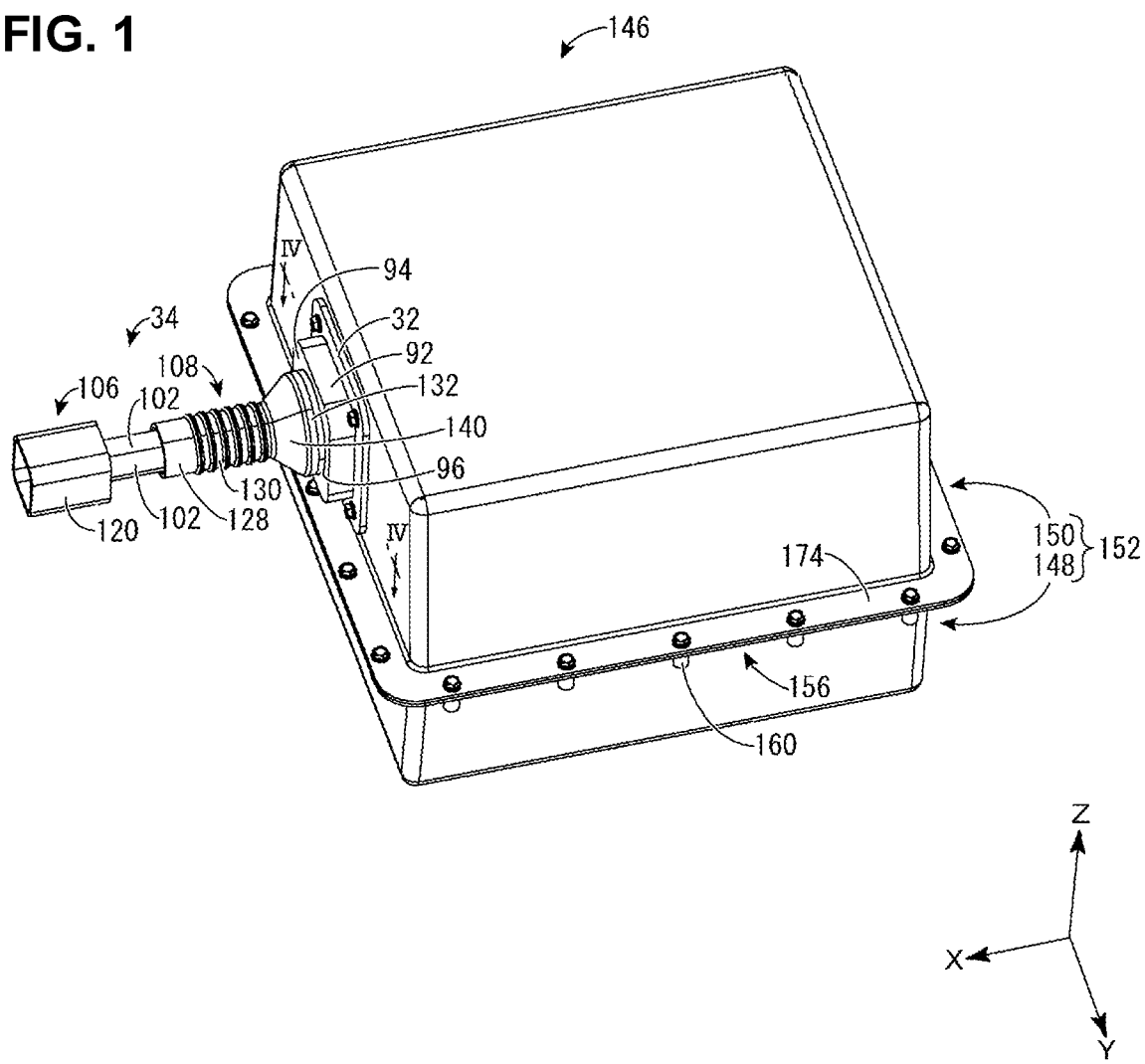
FIG. 1 is an overall perspective view illustrating a state in which an in-vehicle electric component-internal circuit unit according to embodiment 1 is housed inside a housing of an in-vehicle electric component.

First, aspects of embodiment of the present disclosure will be listed and described.

An in-vehicle electric component-internal circuit unit according to the present disclosure is (1) an in-vehicle electric component-internal circuit unit including: an insulative holder that holds a circuit member; a wire harness that includes a coated wire, a circuit-side connection portion that is provided on an end portion on one side of the coated wire and connected to the circuit member, a connector that is provided on an end portion on the other side of the coated wire, and a cylindrical grommet through which the coated wire passes; a plate wall portion for covering a housing through-hole provided in a housing of an in-vehicle electric component; and an annular seal member that is provided on a first surface, which is a surface of the plate wall portion to be attached to the housing, and that comes into contact with the rim of the housing through-hole, wherein the wire harness passes through a grommet attachment hole that is provided so as to extend through the plate wall portion in a plate thickness direction, and the grommet attachment hole is sealed due to the grommet of the wire harness being in close contact with the grommet attachment hole.

According to the in-vehicle electric component-internal circuit unit according to the present disclosure, the connector, which used to be provided on the housing of the in-vehicle electric component in the conventional structure, is provided on the end portion on the other side of the wire harness connected to the circuit member held by the holder. Furthermore, the plate wall portion for covering the housing through-hole provided in the housing of the in-vehicle electric component is attached, via the grommet, to the wire harness connected to the circuit member. As a result, the connector, which used to be provided on the housing of the in-vehicle electric component in the conventional structure, can be connected in advance to the circuit member as a constituent member of the in-vehicle electric component-internal circuit unit. Thus, the work for connecting a circuit unit and a connector provided on a housing, which used to be necessary in the conventional structure, is unnecessary, and the number of in-vehicle electric component-side work processes is reduced. As a result, a space for carrying out the connection work does not need to be secured between the housing and the circuit unit, and in-vehicle electric component size can also be reduced.

Furthermore, the housing through-hole provided in the in-vehicle electric component can be closed by covering the housing through-hole using the plate wall portion attached to the wire harness. The annular seal member, which is provided on the first surface of the plate wall portion to be attached to the housing and which comes into contact with the rim of the housing through-hole, is provided, and the grommet attachment hole provided in the plate wall portion is sealed due to the grommet being in close contact with the grommet attachment hole. Thus, waterproofness of the housing through-hole can be maintained. Here, because the plate wall portion is an in-vehicle electric component-internal circuit unit-side component that is provided separately from the housing of the in-vehicle electric component, the material for the plate wall portion can be selected more flexibly without restriction by the material of the housing. Thus, for example, a material that can advantageously realize the state of close contact between the grommet and the grommet attachment hole can also be selected as desired. In particular, because the volume of the plate wall portion is small compared to that of the entire housing, a better material for the plate wall portion can be selected while suppressing an increase in cost.

In addition, the annular seal member forms a so-called face seal that is sandwiched between the opposing surfaces of the rim of the housing through-hole and the plate wall portion. Thus, allowable assembly errors of the plate wall portion in two directions that are orthogonal to the direction in which the plate wall portion is attached to the housing can also be absorbed by the flexural deformation of the seal member. Note that the plate wall portion may be placed over the housing through-hole from inside the housing or from outside the housing.

Furthermore, in the conventional structure, there were also cases where, depending on the situation, it was necessary to provide an openable/closable opening in the housing of the in-vehicle electric component to carry out the work for connecting a connector and a circuit unit. According to the structure according to the present disclosure, such a structure is also unnecessary because the in-vehicle electric component-internal circuit unit is provided in advance with the connector connected to the circuit member.

(2) The plate wall portion is preferably made of metal. This is because the deformation of the plate wall portion itself is suppressed and the close contact between the grommet and the grommet attachment hole can be maintained even more advantageously, and waterproofness can thus be advantageously ensured.

(3) The first surface of the plate wall portion preferably is a surface facing the circuit-side connection portion. Because the first surface is a surface facing the circuit-side connection portion, the plate wall portion can be attached to the housing from outside the housing. Thus, a large work space can be secured, and work efficiency can be improved. Note that, in a case in which the plate wall portion is placed over and attached to the housing from outside the housing, it suffices to pass the wire harness through the grommet attachment hole of the plate wall portion to place the grommet in close contact with the grommet attachment hole after the plate wall portion has been attached to the housing.

(4) Preferably, a base plate portion on which the holder is mounted and fixed is further included. This is because the circuit member held by the holder can be stably supported due to the holder being mounted on a base plate portion, and thus the durability of the entire circuit unit can be improved.

(5) The base plate portion is preferably provided with a support leg portion that protrudes downward from the base plate portion. Because the base plate portion is provided with the support leg portion, the circuit unit can be mounted above another component housed inside the in-vehicle electric component. Furthermore, the height position of the plate wall portion relative to the housing through-hole can be adjusted easily by changing the protruding length of the support leg portion, and thus an in-vehicle electric component-internal circuit unit with high versatility that can be applied to housing through-holes provided at various height positions can be provided.

(6) The base plate portion is preferably formed using a material that has higher thermal conductivity than the holder. Because the base plate portion is formed using a material that has higher thermal conductivity than the holder, heat transmitted to the holder from the circuit member, which includes heat-generating components such as a relay and a fuse, can be dissipated via a base plate portion.

Details of Embodiments of Present Disclosure

A specific example of the in-vehicle electric component-internal circuit unit according to the present disclosure will be described below with reference to the drawings. Note that the present disclosure is not limited to such examples, but defined in the claims, and is intended to include all modifications within the meaning and the scope equivalent thereof.

Embodiment 1

Embodiment 1 of the present disclosure will be described below with reference to FIGS. 1 to 5. An in-vehicle electric component-internal circuit unit 10 is installed in a vehicle (not illustrated) such as an electric automobile or a hybrid automobile, for example. The in-vehicle electric component-internal circuit unit 10 supplies power from a power source 12 such as a battery to a load 14 such as a motor, and performs control relating thereto (see FIG. 5). Note that, while the in-vehicle electric component-internal circuit unit 10 may be oriented in any direction, in the following description, the Z direction is regarded as the upward direction, the Y direction is regarded as the width direction, and the X direction is regarded as the longitudinally front direction. Furthermore, when more than one of a given member is provided, the reference sign therefor may be provided to only some of the members and may be omitted for the rest.

<Schematic Circuit Configuration of In-vehicle Electric Component-Internal Circuit Unit 10>

Figure 5:
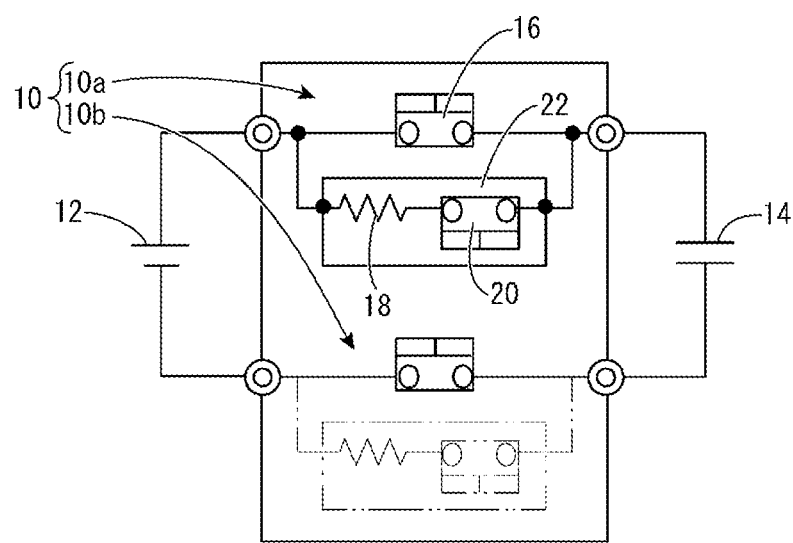
FIG. 5 is a diagram schematically illustrating an electrical configuration of the in-vehicle electric component-internal circuit unit in a path from a power source to a load.

As illustrated in FIG. 5, the in-vehicle electric component-internal circuit unit 10 includes an in-vehicle electric component-internal circuit unit 10a provided on the positive electrode side and an in-vehicle electric component-internal circuit unit 10b provided on the negative electrode side. A positive electrode side of the power source 12 is connected to an input side of the in-vehicle electric component-internal circuit unit 10a, and a negative electrode side of the power source 12 is connected to an input side of the in-vehicle electric component-internal circuit unit 10b. A positive electrode side of the load 14 is connected to an output side of the in-vehicle electric component-internal circuit unit 10a, and a negative electrode side of the load 14 is connected to an output side of the in-vehicle electric component-internal circuit unit 10b. A relay 16 that connects the power source 12 to the load 14 is connected between the input and output sides of each of the in-vehicle electric component-internal circuit units 10a and 10b.

In addition, a precharge circuit 22, in which a precharge resistance 18 and a precharge relay 20 are connected in series so that the relay 16 is bypassed, is connected to the relay 16 connecting the positive electrode sides of the power source 12 and the load 14. Note that, in embodiment 1 of the present disclosure, the precharge resistance 18 is connected to an input side of the precharge relay 20, as illustrated in FIG. 5. Note that, while a precharge circuit 22 is similarly connected also to the relay 16 connecting the negative electrode sides of the power source 12 and the load 14, in embodiment 1 of the present disclosure, illustration of the p recharge circuit 22 connected to the relay 16 connecting the negative electrode sides of the power source 12 and the load 14 is omitted from the drawings to facilitate understanding. Furthermore, both the relay 16 and the precharge relay 20 are relays in which a contact portion is switched on and off by the contact portion being moved in accordance with the conduction state of an excitation coil, and both are controlled on and off by a control circuit inside a power distribution component 154 provided inside a later-described in-vehicle electric component 146. As mentioned up to this point, the in-vehicle electric component-internal circuit units 10a and 10b are provided with substantially the same structure.

<In-Vehicle Electric Component-Internal Circuit Unit 10>

Figure 3:
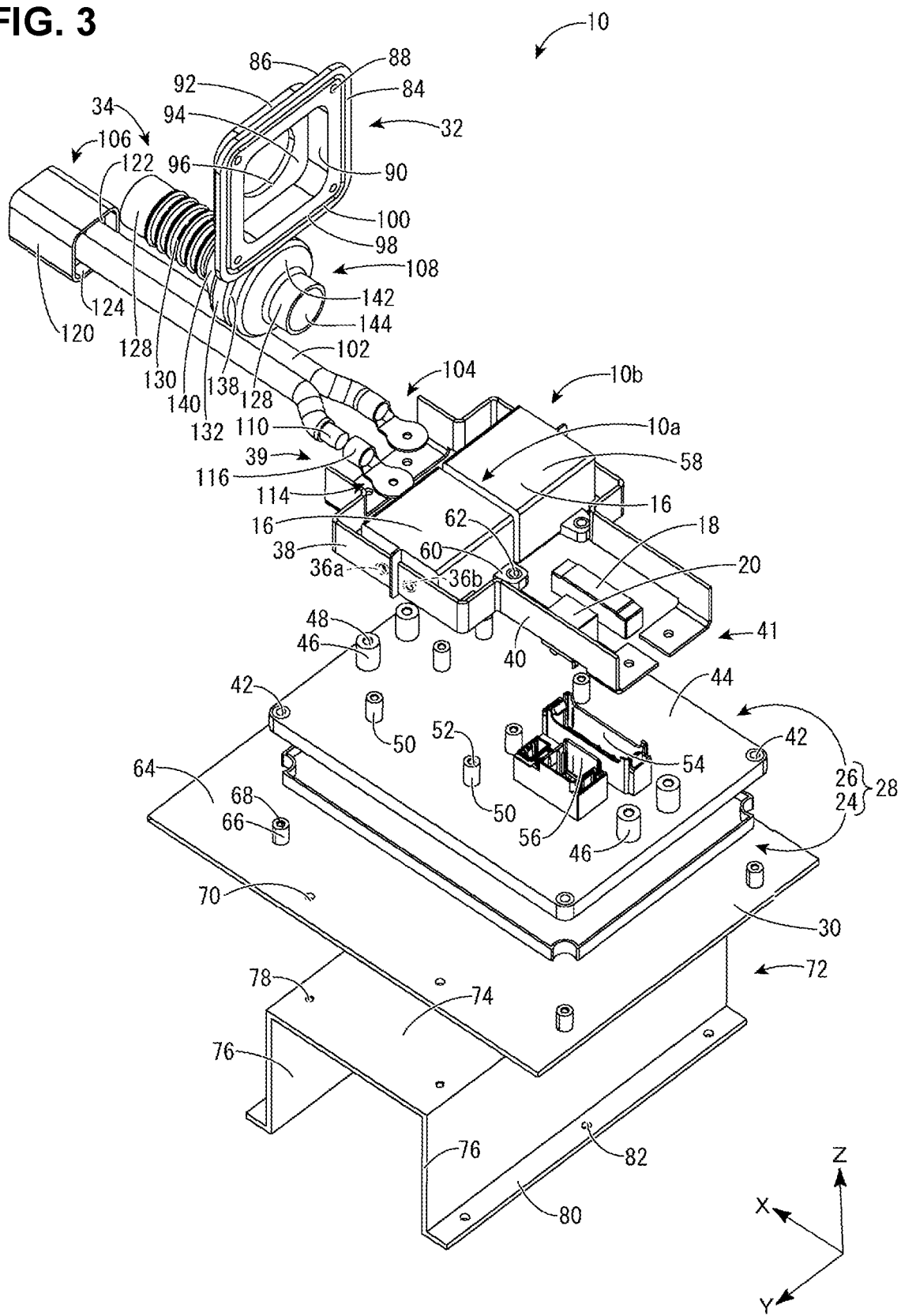
FIG. 3 is an exploded enlarged perspective view of the in-vehicle electric component-internal circuit unit illustrated in FIG. 2.

For example, as illustrated in FIG. 3, the in-vehicle electric component-internal circuit unit 10 includes a lower case 24 that is positioned lower and an upper case 26 that is positioned higher when the in-vehicle electric component-internal circuit unit 10 is installed in a vehicle, and an insulative holder 28 is constituted by the lower case 24 and the upper case 26. Furthermore, the in-vehicle electric component-internal circuit unit 10 includes a base plate portion 30 on which the holder 28 is mounted and fixed. The base plate portion 30 has the shape of a rectangular flat plate, and is formed by die-casting or press-punching, for example. Furthermore, the in-vehicle electric component-internal circuit unit 10 includes a plate wall portion 32 for covering a housing through-hole 180 provided in a housing 152 of the later-described in-vehicle electric component 146. The plate wall portion 32 has the shape of a rectangular flat plate, and is formed by die-casting or press-punching, for example. As described above, the base plate portion 30 and the plate wall portion 32 are formed using a metal such as aluminum or an aluminum alloy. In addition, the in-vehicle electric component-internal circuit unit 10 includes a wire harness 34 for connecting the output sides of the in-vehicle electric component-internal circuit unit 10b and the in-vehicle electric component-internal circuit unit 10a to the load 14.

<Holder 28>

Figure 2:
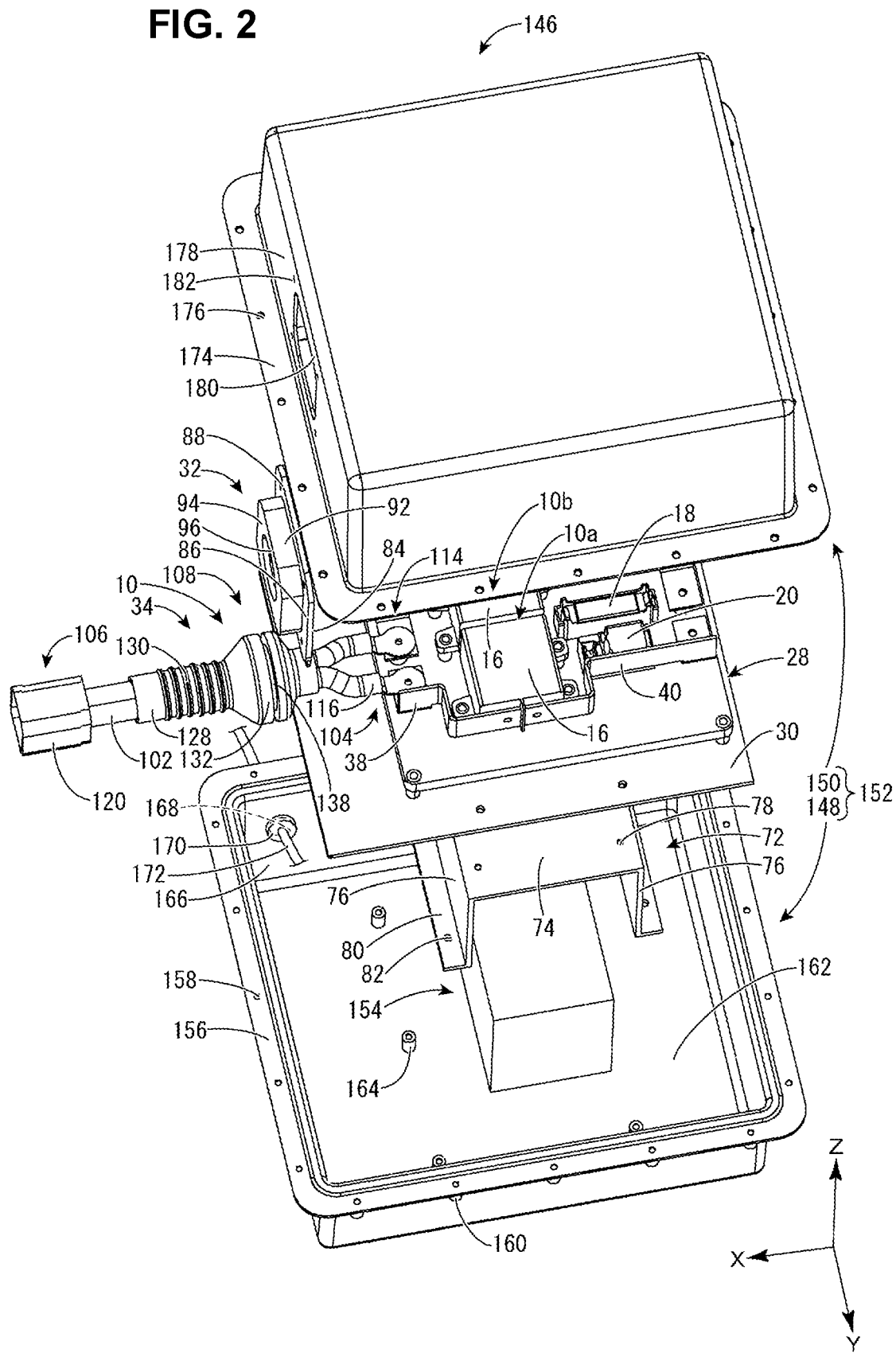
FIG. 2 is an exploded perspective view corresponding to FIG. 1.

In a state in which the lower case 24 and the upper case 26 constituting the holder 28 are attached to one another, unillustrated bus bars for connecting the relays 16 and the precharge circuits 22, unillustrated bus bars for establishing connection inside the precharge circuits 22, etc., are housed inside the holder 28. Furthermore, as illustrated in FIGS. 2 and 3, the two relays 16, and bus bars 38 and 40 that are connected to connection portions 36a and 36b of each of the relays 16 are held by the holder 28 formed by attaching the lower case 24 and the upper case 26 to one another.

<Lower Case 24>

The lower case 24 is formed by injection molding an insulative synthetic resin into a predetermined shape. For example, as illustrated in FIG. 3, the lower case 24 has the overall shape of a flat rectangular box. As illustrated in FIG. 3, the lower case 24 is open upward, and the four corners of the lower case 24 are cut out in the shape of quadrants.

<Upper Case 26>

The upper case 26 is formed by injection molding an insulative synthetic resin into a predetermined shape. For example, as illustrated in FIG. 3, the upper case 26 has the overall shape of a flat rectangular box. The upper case 26 is open downward, and bolt insertion holes 42 are formed in the four corners of the upper case 26. As illustrated in FIG. 3, two bus-bar-fixing cylinder portions 46 each having the shape of a circular cylinder are formed so as to protrude upward on each of the two longitudinal-direction end portions of a top surface 44 of the upper case 26. The two bus-bar-fixing cylinder portions 46 are disposed so as to be separated from one another in the width direction. A bolt hole 48 that is open upward is provided in the upper surface of each bus-bar-fixing cylinder portion 46. Furthermore, six relay-fixing cylinder portions 50 each having the shape of a circular cylinder are formed so as to protrude upward on the longitudinal-direction center portion of the top surface 44 of the upper case 26. A bolt hole 52 that is open upward is provided in the upper surfaces of these relay-fixing cylinder portions 50. Furthermore, on the rearward side of the top surface 44 of the upper case 26, precharge-resistance mounting portions 54 that house the precharge resistances 18 and precharge relay mounting portions 56 that house the precharge relays 20 are provided so as to be open upward.

<Relays 16>

The relays 16 are mechanical relays, and are controlled on and off by the control circuit provided inside the power distribution component 154 of the later-described in-vehicle electric component 146. As illustrated in FIG. 3, the relays 16 each include a block-shaped relay main body 58, the pair of annular connection portions 36a and 36b, and a plurality of (three in the present embodiment) leg portions 60. The leg portions 60 are each formed so as to protrude outward in the shape of a flat plate. The leg portions 60 each have a bolt insertion hole 62 extending therethrough in the vertical direction.

<Bus Bars 38 and 40>

Each pair of the bus bars 38 and 40 is formed by machining metal plate materials that have electroconductivity. For example, as illustrated in FIG. 3, the bus bars 38 and 40 each have a crank shape. End portions on one side of the bus bars 38 and 40 are connected to the connection portions 36a and 36b of the relays 16. End portions 39 on the other side of the bus bars 38 are connected to circuit-side connection portions 104 provided on end portions on one side of coated wires 102 constituting the later-described wire harness 34. End portions 41 on the other side of the bus bars 40 constitute the input sides of the in-vehicle electric component-internal circuit unit 10, and the positive electrode side and the negative electrode side of the power source 12 are connected thereto. Specifically, as described later, the end portions 41 on the other side of the bus bars 40 are connected to a wire harness 172 that is inserted into the housing 152 of the in-vehicle electric component 146 through a wire-harness insertion hole 168 provided in the housing 152 of the in-vehicle electric component 146, as described later, and is connected to the power source 12 (see FIG. 2). Note that the wire harness 172 is attached to the wire-harness insertion hole 168 via a grommet 170, for example, and waterproofness is thus ensured. Furthermore, the wire harness 172 is also connected to the later-described power distribution component 154.

<Base Plate Portion 30>

As illustrated in FIGS. 2 and 3, the in-vehicle electric component-internal circuit unit 10 includes the base plate portion 30, which has the shape of a rectangular flat plate. On the four corners of a top surface 64 of the base plate portion 30, case-fixing cylinder portions 66 each having the shape of a circular cylinder are formed so as to protrude upward. A bolt hole 68 that is open upward is provided in the protruding end surfaces of the case-fixing cylinder portions 66. In addition, in each of the peripheral edge portions of the top surface 64 of the base plate portion 30 facing one another in the width direction, two bolt insertion holes 70 are formed so as to be separated from one another in the longitudinal direction and so as to extend through the base plate portion 30 in the plate thickness direction. Furthermore, the base plate portion 30 is provided with a support leg portion 72.

<Support Leg Portion 72>

As illustrated in FIG. 2, the support leg portion 72 has the shape of a gutter that is open downward and that extends in the width direction (Y direction), and is formed by injection molding an insulative synthetic resin into a predetermined shape. The support leg portion 72 includes a top wall 74 that has the shape of a rectangular flat plate, and a pair of side walls 76 and 76 that protrude downward from the two longitudinal-direction (X-direction) end portions of the top wall 74. Bolt insertion holes 78 are provided so as to extend through the four corners of the top wall 74. In each of the pair of side walls 76 and 76, a support-leg-portion flange portion 80 that extends in the longitudinal direction from the protruding end portion toward the direction separating from the opposite side wall 76 is formed. In each support-leg-portion flange portion 80, bolt insertion holes 82 are formed so as to extend through the support-leg-portion flange portion 80 at three positions that are separated from one another in the width direction (Y direction).

<Plate Wall Portion 32>

As illustrated in FIGS. 2 and 3, the in-vehicle electric component-internal circuit unit 10 includes the plate wall portion 32, which has the shape of a rectangular flat plate. The plate wall portion 32 includes a first surface 84 that is the surface to be placed over and attached to the housing 152 of the later-described in-vehicle electric component 146 and that is positioned toward the rear in FIG. 2, and a second surface 86 that is the surface on the opposite side to the first surface 84 and that is positioned toward the front in FIG. 2.

As illustrated in FIG. 3, bolt insertion holes 88 are provided so as to extend through the four corners of the first surface 84 of the plate wall portion 32. Furthermore, a plate-wall through-hole 90 that has a rectangular cross-sectional shape and that extends through the plate wall portion 32 in the plate thickness direction (front-rear direction) is formed in the center portion of the plate wall portion 32. A cylindrical portion 92 that has the shape of a cylinder protruding toward the front over the entire circumference is provided on the rim portion of the plate-wall through-hole 90. Furthermore, a flange portion 94 that extends inward is formed on the protruding end portion of the cylindrical portion 92, and grommet attachment hole 96 that has a circular cross-sectional shape and that extends through the flange portion 94 in the plate thickness direction (front-rear direction) is formed in the center portion of the flange portion 94.

Figure 4:
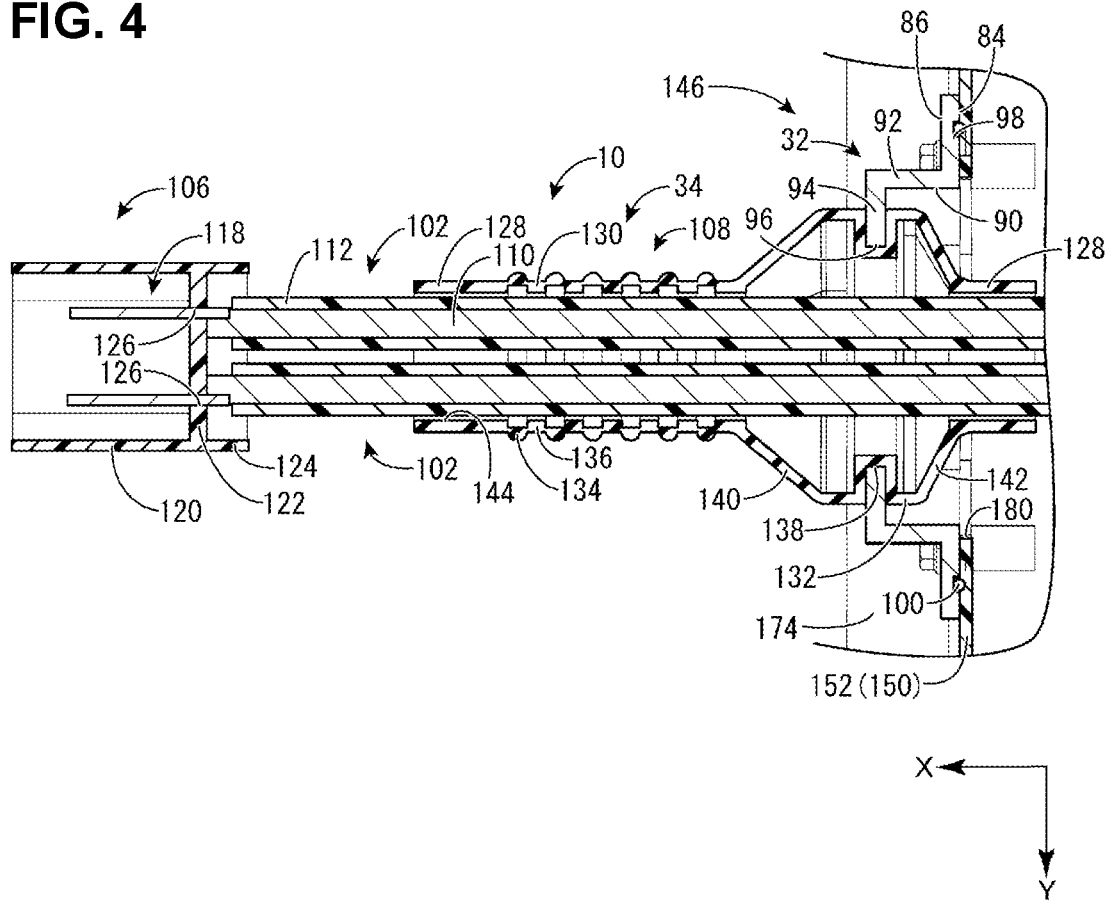
FIG. 4 is an enlarged view of a Iv-Iv cross-section in FIG. 1.

In addition, as illustrated in FIGS. 3 and 4, a seal-member-housing groove portion 98 that has a rectangular cross-sectional shape and that extends over the entire circumference along the rim portion of the plate wall portion 32 is formed in the first surface 84 of the plate wall portion 32. An annular seal member 100 made of rubber is housed inside the seal-member-housing groove portion 98.

<Wire Harness 34>

As illustrated in FIG. 3, the wire harness 34 includes two coated wires 102, and circuit-side connection portions 104 that are provided on end portions on one side (rear end portions in FIG. 3) of the coated wires 102 and that are connected to the bus bars 38 constituting circuit members. Furthermore, the wire harness 34 includes a connector 106 that is provided on end portions on the other side (front end portions in FIG. 3) of the coated wires 102, and a cylindrical grommet 108 through which the coated wires 102 pass.

<Coated Wires 102, Circuit-Side Connection Portions 104>

As illustrated in FIGS. 3 and 4, the coated wires 102 each include a core wire 110 and an insulating coating 112 that covers the core wire 110. Specifically, the coated wires 102 each have a structure in which the core wire 110, which is constituted by a plurality of metal element wires made from a conductor such as copper or aluminum, is covered by the electrically-insulative insulating coating 112, which is made of an ethylene-based resin, a styrene-based resin, or the like. As illustrated in FIG. 3, in the end portion on one side of each coated wire 102, the insulating coating 112 is stripped to expose the core wire 110, and a core-wire crimping portion 116 of a crimp terminal 114 is crimped and connected to the exposed core wire 110. Thus, the circuit-side connection portions 104, which are constituted by tab-shaped connection portions of the crimp terminals 114, are provided on the end portions on one side of the coated wires 102. Furthermore, as illustrated in FIG. 4, the insulating coating 112 is stripped to expose the core wire 110 in the end portion on the other side of each coated wire 102, and an external-side connection portion 118 is formed by a metal plate-shaped member being connected to the exposed core wire 110 using a known technique such as welding.

<Connector 106>

As illustrated in FIGS. 3 and 4, the connector 106 includes a connector housing 120 that is made of a synthetic resin. The connector housing 120 has the shape of a rectangular box that is open toward the front. Furthermore, the connector housing 120 is provided with a cylindrical portion 124 that protrudes in the shape of a circular cylinder toward the rear from the rim portion of a bottom wall 122 of the connector housing 120. In addition, vertically-elongated slit-shaped external-side-connection-portion insertion holes 126 are formed in the bottom wall 122 of the connector housing 120 so as to extend through the bottom wall 122 in the plate thickness direction (see FIG. 4). Furthermore, the connector 106 is provided on the end portions on the other side of the coated wires 102 by the external-side connection portions 118 being pushed into the external-side-connection-portion insertion holes 126 of the connector housing 120.

<Grommet 108>

As illustrated in FIGS. 3 and 4, the grommet 108, through which the coated wires 102 extend, includes a wire insertion portion 128 having the shape of a circular cylinder in each of the two longitudinal-direction (X-direction) end portions thereof, and is formed integrally using a rubber material such as ethylene propylene rubber (EPDM), chloroprene rubber (CR), or silicone rubber (SI). A bellows portion 130 and a large-diameter cylinder portion 132 are provided between the pair of wire insertion portions 128 and 128 provided in the two end portions. The bellows portion 130 has the structure of a bellows-shaped hollow cylinder. Specifically, in the bellows portion 130, annularly-extending mountain portions 134 and valley portions 136 are connected alternately in the longitudinal direction (see FIG. 4), and thus the bellows portion 130 can be stretched in the longitudinal direction and also can be bent in directions (Y and Z directions) that are orthogonal to the longitudinal direction.

An annular groove portion 138 that has a rectangular cross-sectional shape and that extends over the entire circumference is formed in the outer circumferential surface of the large-diameter cylinder portion 132 so that the grommet 108 is fixed to the plate wall portion 32 by the annular groove portion 138 being fitted into the inner edge portion of the grommet attachment hole 96 formed in the plate wall portion 32. The large-diameter cylinder portion 132 is connected to the bellows portion 130 via a diameter-increasing cylinder portion 140. The diameter-increasing cylinder portion 140 is formed so that the diameter thereof increases from the bellows portion 130 toward the large-diameter cylinder portion 132. Furthermore, the large-diameter cylinder portion 132 is connected, via a diameter-decreasing cylinder portion 142, to the wire insertion portion 128 provided in the rear end portion of the grommet 108. The diameter-decreasing cylinder portion 142 is formed so that the diameter thereof decreases from the large-diameter cylinder portion 132 toward the wire insertion portion 128. Furthermore, by connecting a wire insertion portion 128, the bellows portion 130, the diameter-increasing cylinder portion 140, the large-diameter cylinder portion 132, the diameter-decreasing cylinder portion 142, and a wire insertion portion 128 in order from the front side, a coated-wire insertion hole 144 through which the coated wires 102 are passed is formed in the inner surface of the grommet 108 so as to be open in the front-rear direction.

<In-Vehicle Electric Component 146>

The in-vehicle electric component 146 illustrated in FIGS. 1 and 2 is installed in a vehicle (not illustrated) such as an electric automobile or a hybrid automobile, for example. As illustrated in FIG. 2, the in-vehicle electric component 146 includes a lower cover 148 that is positioned lower and an upper cover 150 that is positioned higher when the in-vehicle electric component 146 is installed in a vehicle, and an insulative housing 152 is constituted by the lower cover 148 and the upper cover 150. Furthermore, in the in-vehicle electric component 146, the power distribution component 154, which includes the control circuit, etc., is housed inside the housing 152.

<Lower Cover 148>

As illustrated in FIG. 2, the lower cover 148 is formed by injection molding an insulative synthetic resin into a predetermined shape. The lower cover 148 has the shape of a rectangular box, and is open upward. The lower cover 148 includes a lower-cover flange portion 156 that extends outward in the horizontal direction (width direction and longitudinal direction) over the entire circumference from the opening rim portion. In the lower-cover flange portion 156, a plurality of (twenty in the present embodiment) bolt insertion holes 158 extending through the lower-cover flange portion 156 in the plate thickness direction are provided so as to be separated from one another in the circumferential direction. The bolt insertion holes 158 are formed so as to also extend into lower-cover-fixing cylinder portions 160 that have the shape of a circular cylinder and that protrude downward from the lower surface of the lower-cover flange portion 156. In addition, six support-leg-portion-fixing cylinder portions 164 are provided so as to protrude upward on a bottom surface 162 of the lower cover 148. Furthermore, in a peripheral wall 166 on one width-direction (Y-direction) side of the lower cover 148, the wire-harness insertion hole 168 having a circular cross-sectional shape is formed so as to extend through the peripheral wall 166 in the plate thickness direction. The rubber grommet 170 having the shape of a circular cylinder is fitted into the wire-harness insertion hole 168, and the wire harness 172 is inserted into the housing 152 via a through-hole provided in the center of the grommet 170. Power, etc., is supplied to the in-vehicle electric component-internal circuit unit 10 and the power distribution component 154 of the in-vehicle electric component 146 via the wire harness 172. Furthermore, the entry of water from between the wire-harness insertion hole 168 and the wire harness 172 is prevented by the grommet 170.

<Upper Cover 150, Housing Through-Hole 180>

The upper cover 150 is formed by injection molding an insulative synthetic resin into a predetermined shape. The upper cover 150 has the shape of a rectangular box, and is open downward. The upper cover 150 includes an upper-cover flange portion 174 that extends outward in the horizontal direction (width direction and longitudinal direction) over the entire circumference from the opening rim portion. In the upper-cover flange portion 174, a plurality of (twenty in the present embodiment) bolt insertion holes 176 extending through the upper-cover flange portion 174 in the plate thickness direction are provided so as to be separated from one another in the circumferential direction. Furthermore, in a peripheral wall 178 on the longitudinally front-direction (X-direction) side of the upper cover 150, a housing through-hole 180 that has a horizontally-elongated rectangular cross-sectional shape is formed so as to extend through the peripheral wall 178 in the plate thickness direction. Bolt insertion holes 182 are provided near the four corners of the rim portion of the housing through-hole 180 so as to extend through the rim portion.

<Assembly Process of In-Vehicle Electric Component-Internal Circuit Unit 10>

Subsequently, an example of an assembly process of the in-vehicle electric component-internal circuit unit 10 will be described. The assembly process of the in-vehicle electric component-internal circuit unit 10 is not limited to that disclosed below.

First, the lower case 24 and the upper case 26 constituting the holder 28 are prepared. Next, the assembly of the holder 28 is completed by attaching the lower case 24 and the upper case 26 to one another in a state in which the unillustrated bus bars for connecting the relays 16 and the precharge circuits 22, the unillustrated bus bars for establishing connection inside the precharge circuit 22, etc., are housed inside the holder 28. Subsequently, the precharge resistances 18 and the precharge relays 20 are respectively housed from above into the precharge-resistance mounting portions 54 and the precharge-relay mounting portions 56 provided on the holder 28. In addition, the leg portions 60 of the relays 16 are placed on and fastened using bolts to the relay-fixing cylinder portions 50 provided on the holder 28. Furthermore, the end portions on one side of the bus bars 38 and 40 are connected to the connection portions 36*a* and 36*b* of the relays 16 by being fastened using bolts, and the end portions 39 and 41 on the other side of the bus bars 38 and 40 are placed on the bus-bar-fixing cylinder portions 46 provided on the holder 28. Then, the end portions 39 on the other side of the bus bars 38 are fixed to bus-bar-fixing cylinder portions 46 by being fastened using bolts together with the circuit-side connection portions 104 provided to the crimp terminals 114 of the wire harness 34 as described later. Furthermore, the end portions 41 on the other side of the bus bars 40 are fixed to bus-bar-fixing cylinder portions 46 by being fastened using bolts together with connection members provided to the unillustrated wire harness connected to the power source 12. As a result of the above, circuit members are constituted by the precharge resistances 18 and the precharge relays 20 for forming the precharge circuits 22, the relays 16, the various bus bars housed inside the holder 28, etc. Furthermore, these circuit members are held by the insulative holder 28.

Next, the base plate portion 30 is prepared. Then, the bolt insertion holes 42 provided in the four corners of the holder 28 are mounted on and fixed to the bolt holes 68 of the case-fixing cylinder portions 66 provided on the base plate portion 30 by being fastened using bolts. Thus, the holder 28 is fixed onto the base plate portion 30. Note that the base plate portion 30 is formed using aluminum or an aluminum alloy, and the holder 28 is made of a synthetic resin. In other words, the base plate portion 30 is formed using a material having higher thermal conductivity than the holder 28. Thus, heat transmitted to the holder 28 from the circuit members, which include heat-generating components such as the relays 16 and fuses, can be dissipated via the base plate portion 30.

Subsequently, the base plate portion 30 having the holder 28 mounted and fixed thereon is mounted on the top wall 74 of the support leg portion 72 from above. The bolt insertion holes 70 provided in the base plate portion 30 and the bolt insertion holes 78 provided in the top wall 74 of the support leg portion 72 are positioned relative to one another, and are then fixed to one another by being fastened using bolts. As a result of this, the base plate portion 30 is provided with the support leg portion 72, which protrudes downward (in the opposite direction from the Z-direction arrow) from the base plate portion 30.

Next, the wire harness 34 is prepared. Specifically, the two coated wires 102 are prepared first. Then, in the end portion on one side (the rear end portion in FIG. 3) of each coated wire 102, the insulating coating 112 is stripped to expose the core wire 110, and the core-wire crimping portion 116 of a crimp terminal 114 is crimped to the exposed core wire 110. Thus, the circuit-side connection portions 104 constituted by the tab-shaped connection portions of the crimp terminals 114 are formed on the end portions on one side of the coated wires 102. Furthermore, in the end portion on the other side (the front end portion in FIG. 4) of each coated wire 102, the insulating coating 112 is stripped to expose the core wire 110, and a metal plate-shaped member is connected to the exposed core wire 110 using a known technique such as welding. Thus, the external-side connection portions 118 are formed. Next, the connector housing 120 is prepared, and the external-side connection portions 118 are pushed into the external-side-connection-portion insertion holes 126 of the connector housing 120. Thus, the connector 106 including the external-side connection portions 118 is formed on the end portions on the other side of the coated wires 102.

Subsequently, the grommet 108 is prepared. First, the coated wires 102 having been formed as described above are inserted into the coated-wire insertion hole 144 of the grommet 108 from the circuit-side connection portion 104 side, and the grommet 108 is arranged at a predetermined position on the coated wires 102. As a result of the above, the assembly of the wire harness 34 is completed. Then, the circuit-side connection portions 104 provided in the wire harness 34 having been formed in such a manner are fastened using bolts to the end portions 39 on the other side of the bus bars 38 on the holder 28 having been formed as described above. Finally, the plate wall portion 32 is prepared. Thus, the in-vehicle electric component-internal circuit unit 10 in a state before the plate wall portion 32 is attached to the grommet 108 is prepared.

Next, the in-vehicle electric component-internal circuit unit 10 before the plate wall portion 32 is attached thereto is housed inside the housing 152 of the in-vehicle electric component 146. Specifically, the power distribution component 154 is already housed inside the housing 152 of the in-vehicle electric component 146. The support leg portion 72 provided in the in-vehicle electric component-internal circuit unit 10 is placed on the power distribution component 154 so as to cover the power distribution component 154 from above. Then, the bolt insertion holes 82 provided in the support-leg-portion flange portion 80 of the support leg portion 72 are mounted on the support-leg-portion-fixing cylinder portions 164 provided on the lower cover 148 of the housing 152 of the in-vehicle electric component 146, and are then fixed by being fastened using bolts.

Subsequently, the upper cover 150 is used to cover the lower cover 148 of the in-vehicle electric component 146, on which the in-vehicle electric component-internal circuit unit 10 before the plate wall portion 32 is attached thereto has been mounted. In doing so, the housing through-hole 180 provided in the upper cover 150 is covered in advance using the plate wall portion 32. That is, the bolt insertion holes 88 provided in the plate wall portion 32 are placed over the bolt insertion holes 182 provided in the upper cover 150 from the outside, and are fastened to the bolt insertion holes 182 using bolts. Thus, the housing through-hole 180 provided in the upper cover 150 constituting the housing 152 of the in-vehicle electric component 146 is covered by the plate wall portion 32. Here, as illustrated in FIG. 4, the annular seal member 100 coming into contact with the rim of the housing through-hole 180 is provided on the first surface 84 (the rear surface in FIG. 4), which is the surface of the plate wall portion 32 to be attached to the upper cover 150 constituting the housing 152. Furthermore, as illustrated in FIG. 3, the first surface 84 of the plate wall portion 32 is a surface facing the circuit-side connection portions 104. Specifically, a surface facing the circuit-side connection portions 104 is a surface facing the circuit-side connection portions 104 in the X direction.

Finally, the upper cover 150 having the housing through-hole 180 covered by the plate wall portion 32 is used to cover the lower cover 148 of the in-vehicle electric component 146, on which the in-vehicle electric component-internal circuit unit 10 before the plate wall portion 32 is attached thereto has been mounted. In doing so, first, the external-side connection portion 118 side of the wire harness 34 of the in-vehicle electric component-internal circuit unit 10 is passed through the housing through-hole 180 and the grommet attachment hole 96 from inside the upper cover 150. In this state, the upper-cover flange portion 174 is placed over the lower-cover flange portion 156. Subsequently, the inner edge portion of the grommet attachment hole 96 formed in the plate wall portion 32 is fitted into the annular groove portion 138 of the grommet 108 of the wire harness 34. Then, the bolt insertion holes 176 in the upper-cover flange portion 174 are placed over and fastened using bolts to the bolt insertion holes 158 in the lower-cover flange portion 156. As a result of this, the in-vehicle electric component-internal circuit unit 10 is housed and retained inside the housing 152 of the in-vehicle electric component 146. Thus, as illustrated in FIG. 4, the wire harness 34 passes through the grommet attachment hole 96 provided so as to extend through the plate wall portion 32 in the plate thickness direction (the X direction in FIG. 4). Moreover, because the grommet 108 constituting the wire harness 34 is in close contact with the grommet attachment hole 96, the grommet attachment hole 96 is sealed by the grommet 108. Furthermore, the annular seal member 100 is sandwiched between the plate wall portion 32 and the rim of the housing through-hole 180.

According to the in-vehicle electric component-internal circuit unit 10 according to the present disclosure provided with such a structure, the connector, which conventionally used to be provided on the housing 152 of the in-vehicle electric component 146, is provided on the end portion on the other side of the wire harness 34 constituting the in-vehicle electric component-internal circuit unit 10. Moreover, the plate wall portion 32 covering the housing through-hole 180 provided in the housing 152 of the in-vehicle electric component 146 is attached, via the grommet 108, to the wire harness 34 constituting the in-vehicle electric component-internal circuit unit 10. Thus, the connector, which conventionally used to be provided on the housing 152 of the in-vehicle electric component 146, can be configured as the connector 106 constituting the in-vehicle electric component-internal circuit unit 10. Accordingly, the work for connecting the connector provided on the housing 152 and the in-vehicle electric component-internal circuit unit, which conventionally used to be necessary, is unnecessary, and the number of work processes is reduced. Moreover, a space for carrying out the connection work does not need to be secured between the housing 152 and the in-vehicle electric component-internal circuit unit, and thus the size of the in-vehicle electric component 146 can also be reduced.

Furthermore, the housing through-hole 180 provided in the housing 152 of the in-vehicle electric component 146 is covered by the plate wall portion 32. Moreover, because the annular seal member 100, which comes into contact with the rim of the housing through-hole 180, is provided between the plate wall portion 32 and the housing 152, the infiltration of water from a gap between the plate wall portion 32 and the housing 152 is prevented. Furthermore, because the grommet attachment hole 96 is sealed due to the grommet 108 constituting the wire harness 34 being in close contact with the grommet attachment hole 96, the infiltration of water from a gap between the wire harness 34 and the grommet attachment hole 96 is also prevented. Note that, because the plate wall portion 32 is an in-vehicle electric component-internal circuit unit 10-side component, the material for the plate wall portion 32 can be selected more flexibly without restriction by the material of the housing 152 of the in-vehicle electric component 146. Thus, by forming the plate wall portion 32 from a metal (aluminum or an aluminum alloy in the present embodiment) as in the present embodiment, for example, the state of close contact between the grommet 108 and the grommet attachment hole 96 in the plate wall portion 32 can be advantageously realized, and waterproofness can thus be advantageously ensured. Moreover, because the plate wall portion 32 is small compared to the entire in-vehicle electric component 146, a better material for the plate wall portion 32 can be selected while suppressing an increase in cost.

Furthermore, because the first surface 84, which is the surface of the plate wall portion 32 to be attached to the upper cover 150 constituting the housing 152, is a surface facing the circuit-side connection portions 104 of the wire harness 34, the plate wall portion 32 can be attached from outside the upper cover 150. Thus, a large work space can be secured, and work efficiency can be improved.

In addition, the annular seal member 100 forms a so-called face seal that is sandwiched between the opposing surfaces of the rim of the housing through-hole 180 and the plate wall portion 32. Thus, allowable assembly errors of the plate wall portion 32 in two directions that are orthogonal to the direction in which the plate wall portion 32 is attached to the housing 152 can also be absorbed by the flexural deformation of the seal member 100.

Furthermore, conventionally, there were also cases where it was necessary to provide an openable/closeable opening in the housing 152 of the in-vehicle electric component 146 in order to connect the connector 106 and the bus bars 38 constituting circuit members. However, according to the present embodiment, such an opening is also unnecessary because the in-vehicle electric component-internal circuit unit 10 is provided in advance with the connector 106 connected to the bus bars 38.

Furthermore, because the in-vehicle electric component-internal circuit unit 10 includes the base plate portion 30, on which the holder 28 is mounted and fixed, the circuit members held by the holder 28 can be stably supported, and thus the durability of the entire in-vehicle electric component-internal circuit unit 10 can be improved.

In addition, because the base plate portion 30 is provided with the support leg portion 72, the in-vehicle electric component-internal circuit unit 10 can be mounted on the power distribution component 154 housed inside the in-vehicle electric component 146, for example. Furthermore, the height position of the in-vehicle electric component-internal circuit unit 10 relative to the housing through-hole 180 can be adjusted easily by changing the protruding length of the side walls 76 of the support leg portion 72. Thus, the in-vehicle electric component-internal circuit unit 10 can be applied to housing through-holes 180 provided at various height positions.

OTHER EMBODIMENTS

The technique disclosed in the present specification is not limited to the embodiment described based on the description above and the drawings, and embodiment such as those described below, for example, are also included in the technical scope of the technique disclosed in the present specification.

(1) In the present embodiment, the plate wall portion 32 is placed over the rim of the housing through-hole 180 from outside the housing 152. However, there is no limitation to this. For example, the plate wall portion 32 may be placed over the rim of the housing through-hole 180 from inside the housing 152. In this case, the plate wall portion 32 and the grommet 108 can be attached to one another before the in-vehicle electric component-internal circuit unit 10 is mounted on the housing 152.

(2) In the present embodiment, description is provided while referring to an example of the in-vehicle electric component 146 in which the power distribution component 154 and the in-vehicle electric component-internal circuit unit 10 according to the present disclosure are housed inside the housing 152. However, there is no limitation to this. For example, the in-vehicle electric component 146 may be a battery pack in which a battery is housed in place of the power distribution component 154. In this case, the wire-harness insertion hole 168 need not be provided in the housing 152.

(3) In the present embodiment, the support leg portion 72 is fixed to the bottom surface 162 of the housing 152. However, there is no limitation to this. The support leg portion 72 may be fixed to any position of the housing 152, such as the peripheral walls 178. Furthermore, while the support leg portion 72 was separate from the base plate portion 30, the support leg portion 72 may be formed integrally with the base plate portion 30 or may not be included.

LIST OF REFERENCE NUMERALS

10 In-vehicle electric component-internal circuit unit
10a In-vehicle electric component-internal circuit unit
10b In-vehicle electric component-internal circuit unit
12 Power source
14 Load
16 Relay
18 Precharge resistance
20 Precharge relay
22 Precharge circuit
24 Lower case
26 Upper case
28 Holder
30 Base plate portion
32 Plate wall portion
34 Wire harness
36a Connection portion
36b Connection portion
38 Bus bar
39 End portion on other side
40 Bus bar
41 End portion on other side
42 Bolt insertion hole
44 Top surface
46 Bus-bar-fixing cylinder portion
48 Bolt hole
50 Relay-fixing cylinder portion
52 Bolt hole
54 Precharge-resistance mounting portion
56 Precharge-relay mounting portion
58 Relay main body
60 Leg portion
62 Bolt insertion hole
64 Upper surface
66 Case-fixing cylinder portion
68 Bolt hole
70 Bolt insertion hole
72 Support leg portion
74 Top wall
76 Side wall
78 Bolt insertion hole
80 Support-leg-portion flange portion
82 Bolt insertion hole
84 First surface
86 Second surface
88 Bolt insertion hole
90 Plate-wall through-hole
92 Cylindrical portion
94 Flange portion
96 Grommet attachment hole
98 Seal-member-housing groove portion
100 Seal member
102 Coated wire
104 Circuit-side connection portion
106 Connector
108 Grommet
110 Core wire
112 Insulating coating
114 Crimp terminal
116 Core-wire crimping portion
118 External-side connection portion
120 Connector housing
122 Bottom wall
124 Cylindrical portion
126 External-side-connection-portion insertion hole
128 Wire insertion portion
130 Bellows portion
132 Large-diameter cylinder portion
134 Mountain portion
136 Valley portion
138 Annular groove portion
140 Diameter-increasing cylinder portion
142 Diameter-decreasing cylinder portion
144 Coated-wire insertion hole
146 In-vehicle electric component
148 Lower cover
150 Upper cover
152 Housing
154 Power distribution component
156 Lower-cover flange portion
158 Bolt insertion hole
160 Lower-cover-fixing cylinder portion
162 Bottom surface
164 Support-leg-portion-fixing cylinder portion
166 Peripheral wall
168 Wire-harness insertion hole
170 Grommet
172 Wire harness
174 Upper-cover flange portion
176 Bolt insertion hole
178 Peripheral wall
180 Housing through-hole
182 Bolt insertion hole

The invention claimed is:

1. An in-vehicle electric component-internal circuit unit comprising:
an insulative holder that holds a circuit member;
a wire harness that includes a coated wire, a circuit-side connection portion that is provided on an end portion on one side of the coated wire and connected to the circuit member, a connector that is provided on an end portion on the other side of the coated wire, and a cylindrical grommet through which the coated wire passes;
a plate wall portion for covering a housing through-hole provided in a housing of an in-vehicle electric component; and
an annular seal member that is provided on a first surface of the plate wall portion configured to be attached to the housing, and that comes into contact with the rim of the housing through-hole,
wherein the wire harness passes through a grommet attachment hole that extends through the plate wall portion in a plate thickness direction, and the grommet attachment hole is sealed due to the grommet of the wire harness being in close contact with the grommet attachment hole.

2. The in-vehicle electric component-internal circuit unit according to claim 1, wherein the plate wall portion is made of metal.

3. The in-vehicle electric component-internal circuit unit according to claim 1, wherein the first surface of the plate wall portion is a surface facing the circuit-side connection portion.

4. The in-vehicle electric component-internal circuit unit according to claim 1 further comprising a base plate portion on which the holder is mounted and fixed.

5. The in-vehicle electric component-internal circuit unit according to claim 4, wherein the base plate portion is provided with a support leg portion that protrudes downward from the base plate portion.

6. The in-vehicle electric component-internal circuit unit according to claim 4, wherein the base plate portion is formed using a material that has higher thermal conductivity than the holder.

* * * * *